United States Patent [19]

Zajac

[11] 4,342,901
[45] Aug. 3, 1982

[54] PLASMA ETCHING ELECTRODE

[75] Inventor: John Zajac, San Jose, Calif.

[73] Assignee: Eaton Corporation, Cleveland, Ohio

[21] Appl. No.: 176,875

[22] Filed: Aug. 11, 1980

[51] Int. Cl.³ .............................................. B23K 9/00
[52] U.S. Cl. ...................... 219/121 PD; 219/121 PG; 219/121 PF; 156/646; 422/186.05
[58] Field of Search ................. 219/121 PD, 121 PG, 219/121 PE, 121 PF; 204/298, 192 E; 156/643, 646; 250/531, 535, 539

[56] References Cited

U.S. PATENT DOCUMENTS

| 4,148,705 | 4/1979 | Battey et al. | 156/643 |
| 4,158,589 | 6/1979 | Keller et al. | 204/192 E |
| 4,209,357 | 6/1980 | Gorin et al. | 156/643 |
| 4,230,515 | 10/1980 | Zajac | 204/192 E |

Primary Examiner—B. A. Reynolds
Assistant Examiner—M. Paschall
Attorney, Agent, or Firm—Frank M. Sajovec, Jr.

[57] ABSTRACT

A planar plasma etcher (10) wherein a plurality of projections (36, 136, 236) extend from one electrode (18), with each projection aligned with a wafer (22) placed on the second electrode (20) to provide uniform etching across the surface of each wafer. The surface of the projection facing the wafer can take several forms depending on etching conditions, including convex, concave or frusto-conical.

9 Claims, 5 Drawing Figures

PLASMA ETCHING ELECTRODE

The gas plasma vapor etching process has been utilized in the past for performing etching operations on semiconductor wafers by exposing the wafers to an active plasma to remove portions of materials carried by the semiconductor structure. The extension of reactive plasma etching beyond the patterning of silicon, silicon nitride and silicon oxide has greatly expanded the horizons of plasma etching to include, among other things, the etching of aluminum in the production of small geometry integrated circuits. Plasma, as compared to chemical etching, produces better edge definition, less undercutting, considerably less photoresist adhesion sensitivity, and the elimination of so-called "knee breakdown" due to thinning of the photoresist at sharp edges. This thinning where the aluminum gos over and down the side wall of a cut leads to premature resist failure during wet etching, thus permitting removal of the metal at the near edge.

Although plasmas are not clearly understood, it is known that a special form of chemical materials can be made by exposing the compounds to high energy radio frequencies. Under the influence of these radio frequencies, compounds break down and rearrange to form transitory species with life spans so short that they are difficult to identify. Accordingly, unexpected reactions can be effected in a plasma that are difficult or impossible to effect using more conventional techniques. For example, a plasma of a very inert gas such as fluorocarbons known commercially as Freons, will etch glass, indicating that an active fluorine species is present in the plasma. In addition to the active chemical species, there are strong radiations, such as ultraviolet, and strong ion and electron bombardment of the surfaces within the plasma.

One of the great difficulties in plasma etching is the failure to achieve uniform etching of the wafer. As noted in U.S. Pat. No. 3,879,597, the edges of wafers are etched more deeply than the centers which results in a lack of uniformity of etching across individual wafers. This was partially remedied by employing slower etching rates, which cause less attack on the resist and by using greater spacing between the wafers. The referenced patent also employs a perforated inner chamber which partially prevents photoresist attack.

It is thus an object of the present invention to provide a plasma etching apparatus wherein each wafer is uniformly etched across its surface.

To meet the above objective the present invention provides a plasma etching apparatus including first and second space electrodes with the wafers to be etched distributed about one of the electrodes, wherein the first electrode is shaped such that there is a protuding surface or projection extending from the electrode adjacent each wafer distributed across the second or wafer electrode. In accordance with one aspect of the invention the surface of the projection facing the wafer is generally spherical and convex. In accordance with another aspect of the invention each projection is formed as a series of inverted frusto-conical sections stacked together to define a surface facing the wafer which is generally spherical, but having a flat surface directly over the central area of the wafer. To meet certain etching conditions the projection can also have a concave surface adjacent the wafer.

Other objects and advantages will become apparent from the following description when taken in connection with the accompanying drawings, wherein.

Figure 1:
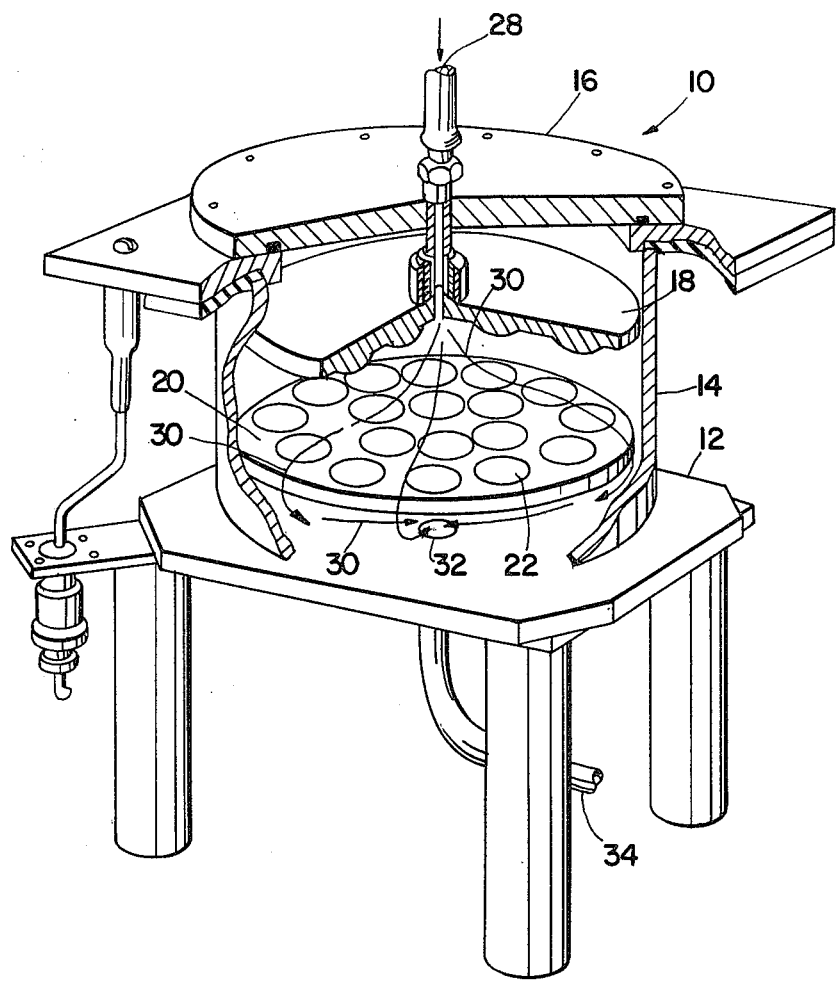
FIG. 1 is a perspective view of a plasma etching apparatus.

Referring to FIG. 1, there is illustrated a plasma etching apparatus 10, comprising a base 12, a chamber 14 resting on the base, a top plate 16 closing the top of the chamber 14, an upper electrode 18, and a lower electrode 20. Wafers 22 to be etched are distributed about the top surface of the lower electrode 20 in a preselected pattern. The wafers can be positioned on the lower electrode by means of small depression formed in the electrode surface; however, it is not important to the invention that they be retained in position in any way so long as they are arranged in a pattern.

As shown, herein, the upper and lower electrodes are stationary. It will be appreciated, however, that in accordance with known practice in the art, the upper and lower electrodes can be rotated in synchronization with one another as a means to obtain more uniform etching from wafer to wafer, or they can be relatively rotated so long as they are stationary relative to one another for a predetermined length of time at some point in the etching cycle.

Gas which will form the plasma enters the chamber 14 through a conduit 28 extending through the top plate 16 and the upper electrode 18. The gas passes through the top electrode and circulates as indicated by the arrows 30. Once the plasma has passed over the wafers 22, it is collected through orifice 32 formed in the base 12 via a vacuum connection 34.

Figure 2:
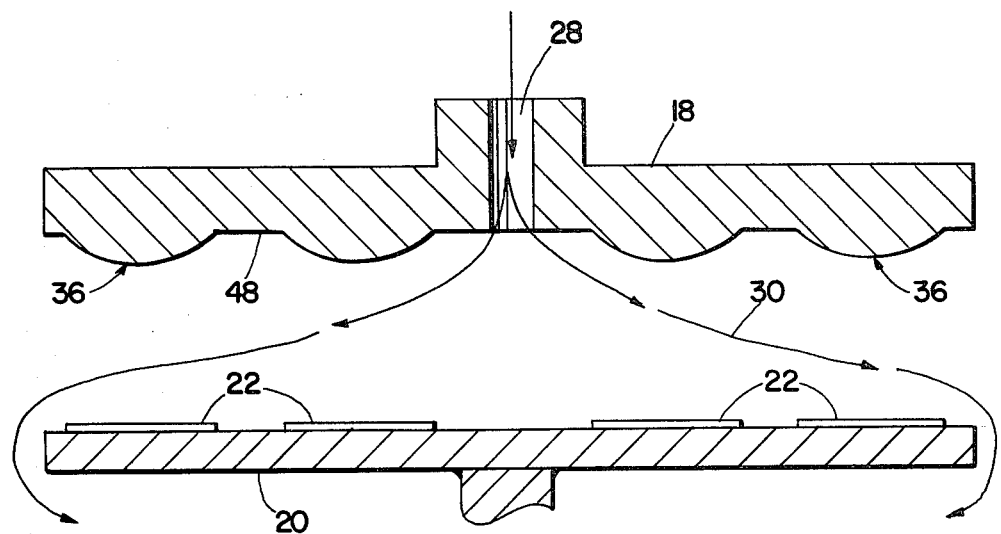
FIG. 2 is a cross-sectional view of the electrode configuration of the present invention.
Figures 3, 4:
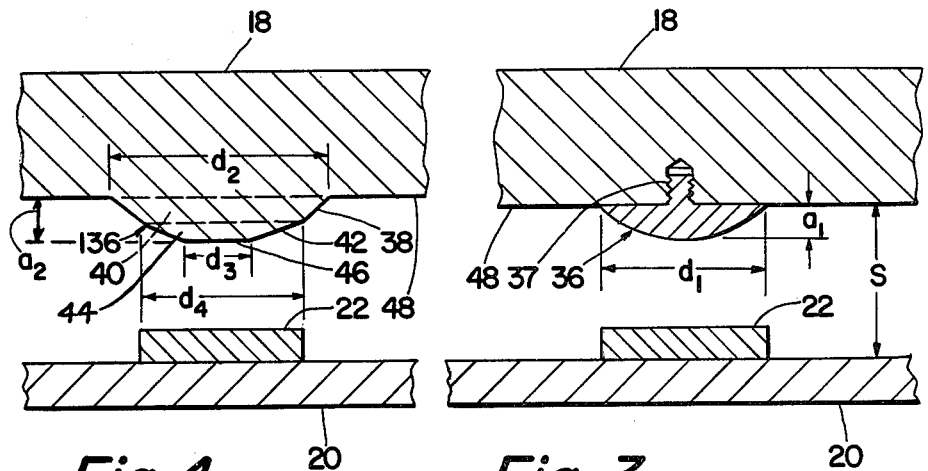
FIG. 3 is an enlarged fragmentary cross-sectional view of one embodiment of the invention.
FIG. 4 is an enlarged fragmentary cross-sectional view of a preferred embodiment of the invention.

Viewing FIGS. 1 and 2 together, traditional planar plasma etchers have two electrodes which sandwich the wafers. Unlike traditional designs, the upper electrode 18 has been modified such that a plurality of projections 36 are formed on the underside of the upper electrode extending downwards toward the lower electrode 20. The projections are generally in the form of spherical segments and are arranged in a pattern corresponding to the pattern in which the wafers 22 are arranged on the lower electrode, so that a projection 36 overlies each wafer 22. This configuration results in a reduced gap between the electrodes at the center of each wafer, increasing the current density at the center of each wafer, and results in uniform etching across the surface of each wafer. As shown in FIGS. 2 and 3, the projection 36 can be formed as a spherical segment extending from the electrode surface; however, it should be appreciated that the protrusion 36 and take the form of a cylinder extending downward from the upper electrode 18 with a spherical surface formed on the end facing the wafer 22.

Initial experiments using simple cylindrical projections demonstrated that the concept was viable, that is that etching uniformity across an individual wafer is affected by the presence of a projection extending from one electrode and aligned with the wafer. Additional experiments were then conducted in an effort to optimize the shape of the projections, in accordance with the following examples:

Referring to FIG. 3, there is illustrated a configuration wherein the projection 36 is formed as a spherical or convex segment having a diameter of $d_1$ and a height $a_1$ and attached to the electrode 18 by means of a threaded boss 37 received in a corresponding threaded hole formed in the electrode. The actual relationship between $d_1$ and $a_1$, depends upon wafer diameter, the distance s between electrodes, the specific gas being used, and the pressure of the gas. While this configuration produced a significant improvement in etching uniformity across the wafer as compared with a flat electrode, the experiments conducted therewith indicated that surfaces other than spherical produced further desirable changes in the uniformity obtained Referring to FIG. 4, there is illustrated a preferred configuration of the projection, designated 136, which takes the general form of a series of stacked frusto-conical sections having a first diameter $d_2$, a maximum height $a_2$, a minimum diameter $d_3$ and an intermediate diameter $d_4$. The diameters $d_2$ and $d_4$ and a first surface 38 therebetween define a first frusto-conical section 40, and diameters $d_3$ and $d_4$ and a second surface 42 therebetween define a second frusto-conical section 44. It can be appreciated that in some cases additional frusto-conical sections may be desirable to obtain optimum uniformity; however, the two sections 40 and 44 are used herein to illustrate the general configuration of the preferred form of projection.

While a simple frusto conical section having a major diameter $d_2$ and a minor diameter $d_3$ was found to be generally effective, superior results were obtained when the intermediate diameter $d_4$ was introduced, forming a stacked pair of frusto-conical sections having side surfaces 38 and 42 with the surfaces 38 and 42 formed at different angles to the bottom surface 48 of the upper electrode. In the latter configuration, surface 38 controls the etching of the outer edge of the wafer 22, surface 44 controls an annular intermediate area of the wafer, and the surface 46 defined by the minor diameter $d_3$ controls the etching of the center of the wafer.

Tests conducted using the FIG. 4 configuration for etching aluminum with carbon tetrachloride at a pressure of 250 microns at 55 cc per minute as the plasma gas, indicated that the maximum projection diameter is preferably slightly greater than the diameter of the wafer. For example, the optimum major diameter $d_2$ for a 3 in. diameter wafer was 3.25 in. Also, for a 3 in. diameter wafer with surfaces 38 and 42 of equal length the optimum minor diameter $d_3$ was 0.75 in., and the optimum dimension $a_2$ was in the range of from 3/16 in. to ⅜ in.

Figure 5:
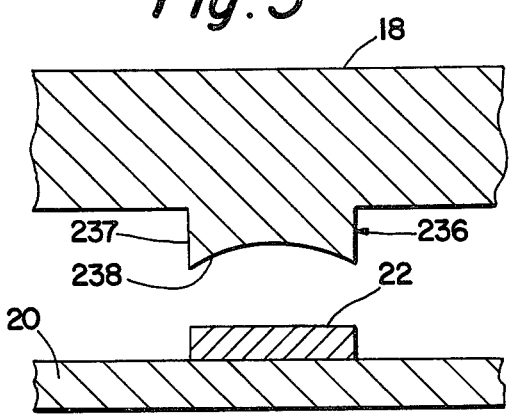
FIG. 5 is an enlarged fragmentary cross-sectional view of an alternative embodiment of the invention.

As described above, in the FIG. 3 configuration, the projection 36 is shown as a separate part attached to the upper electrode 18 by means of a centrally disposed, threaded stub shaft 37 formed on the projection and received in a threaded hole in the upper electrode. The FIG. 4 configuration is shown with the projection 136 as an integral part of the upper electrode; however, it too can be formed as one or more separate parts attached to the electrode as in FIG. 3. For certain etching conditions cylindrical spacers can be placed between the projections and the electrode to reduce the distance between the projections and the wafer. With the use of such spacers the configuration of the projection would be generally cylindrical, with the surface facing the wafer being configured as shown in FIGS. 3 or 4. It has also been found that under certain conditions more uniform etching can be obtained when the projection is formed with a concave surface facing the wafer, such that there is a reduced gap at the edges of the wafer. In FIG. 5 there is shown such a configuration; wherein a projection 236 is formed as a cylindrical portion 237 extending from the electrode 18 and having a concave surface 238 formed therein facing the wafer 22.

In operation, the specific electrode configuration used would be selected depending on the nature of the wafer surface to be etched, the gas to be used, electrical power levels and other parameters. Regardless of the exact configuration used, the upper electrode 18 would be formed, as illustrated in FIG. 1, with the projections 36/136 arranged about the electrode in a pattern corresponding to the pattern in which the wafers 22 are be arranged on the lower electrode so that each projection can be aligned above a wafer.

With the wafers in place on the lower electrode, the wafers can then be etched in a conventional manner by introducing a gas into the chamber 14 and applying rf energy to the electrodes.

It can be appreciated that while the invention is illustrated herein in a plasma etching apparatus 10 wherein the electrodes are oriented horizontally, the invention is not restricted to such orientation of the electrodes and will function equally effectively in an etching apparatus wherein the electrodes are oriented vertically or otherwise.

I claim:

1. In a planar plasma etcher having a first electrode, and a second electrode spaced from the first and including means for receiving a plurality of wafers in a predetermined position or positions thereon; the improvement wherein the surface of said first electrode facing said second electrode is formed with a plurality of projections thereon and extending therefrom toward said second electrode.

2. Apparatus as claimed in claim 1, in which each of said one or more projections is in substantial alignment with a corresponding one or more of said wafers.

3. Apparatus as claimed in claim 2, in which each of said projections is substantially circular in horizontal cross section.

4. Apparatus as claimed in claim 3, in which the surface of each of said projections facing said second electrode is formed with its center spaced a first predetermined distance from said second electrode and its circumferential edge spaced a second predetermined distance from said second electrode.

5. Apparatus as claimed in claim 4, in which the surface of each of said projections facing said second electrode is convex.

6. Apparatus as claimed in claim 4, in which the surface of each of said projections facing said second electrode is concave.

7. Apparatus as claimed in claim 4, in which each of said projections is formed as at least one frustum of a cone with its smaller diameter base disposed nearest said second electrode.

8. Apparatus as claimed in claim 7, in which each of said projections is formed as a plurality of frusta of cones stacked together with the base of smallest diameter nearest said second electrode and the larger diameter base of one frustum forming the smaller diameter base of the next frustum in the stack.

9. Apparatus as claimed in claims 3, 4, 5, 6, 7 or 8, in which said etcher is adapted to etch circular wafers, each of said projections having a major diameter at least as large as the diameter of the wafers to be etched.

* * * * *